United States Patent
Stark et al.

(10) Patent No.: US 11,209,247 B2
(45) Date of Patent: Dec. 28, 2021

(54) RADIATION SOURCE FOR MICROWAVE PULSES AND RADIATION DEVICE

(71) Applicant: DIEHL DEFENCE GMBH & CO. KG, Ueberlingen (DE)

(72) Inventors: Robert Stark, Bad Windsheim (DE); Martin Hertel, Lauf (DE)

(*) Notice: Subject to any disclaimer, the term of this patent is extended or adjusted under 35 U.S.C. 154(b) by 270 days.

(21) Appl. No.: 16/435,755

(22) Filed: Jun. 10, 2019

(65) Prior Publication Data

US 2019/0376769 A1 Dec. 12, 2019

(30) Foreign Application Priority Data

Jun. 8, 2018 (DE) ...................... 10 2018 004 568.5

(51) Int. Cl.
*F41H 13/00* (2006.01)

(52) U.S. Cl.
CPC ..... *F41H 13/0093* (2013.01); *F41H 13/0068* (2013.01)

(58) Field of Classification Search
CPC ............. F41H 13/0093; F41H 13/0068; F41H 13/0075
See application file for complete search history.

(56) References Cited

U.S. PATENT DOCUMENTS

| | | | |
|---|---|---|---|
| 3,390,333 A | 6/1968 | Klawsnik et al. | |
| 6,075,495 A * | 6/2000 | Podgorski | G01R 29/0821 343/776 |
| 8,358,176 B2 | 1/2013 | Stark et al. | |
| 8,576,109 B2 | 11/2013 | Stark et al. | |
| 8,982,010 B2 | 3/2015 | Umerski | |
| 2004/0190214 A1 | 9/2004 | Dommer et al. | |
| 2005/0231041 A1 | 10/2005 | Brown | |

(Continued)

FOREIGN PATENT DOCUMENTS

| | | |
|---|---|---|
| DE | 102006014230 A1 | 10/2007 |
| DE | 102010024214 A1 | 12/2011 |

(Continued)

OTHER PUBLICATIONS

Sokolov A. A. et al.: "Test and Standard Sources of Electromagnetic Pulses", Ultrawideband and Ultrashort Impulse Signals, The Third International Conference, IEEE, PI, Sep. 30, 2006 (Sep. 30, 2006), pp. 60-65, XP031046649, DOI: 10.1109/UWBUS.2006.307159, ISBN: 978-1-4244-0513-8.

*Primary Examiner* — Arman B Fallahkhair
(74) *Attorney, Agent, or Firm* — Laurence A. Greenberg; Werner H. Stemer; Ralph E. Locher

(57) ABSTRACT

A radiation source for emitting an electromagnetic HPEM microwave pulse contains a microwave generator for generating the pulse. The generator has a generator opening for outputting the pulse. A horn structure is provided for shaping the pulse. The horn structure has an input opening, which is connected to the generator opening and is intended to radiate in the pulse, and an emission opening for emitting the shaped pulse. The generator contains at least two pulse sources for respectively generating a pulse component. The pulse is the sum of the pulse components. A radiation device contains such a radiation source and a control device for triggering the pulse sources in a temporally synchronized manner for the purpose of respectively emitting a pulse component.

16 Claims, 4 Drawing Sheets

(56) References Cited

U.S. PATENT DOCUMENTS

| | | | | |
|---|---|---|---|---|
| 2011/0309870 A1* | 12/2011 | Stark | ................... | F41H 13/0068 |
| | | | | 327/181 |
| 2012/0098607 A1 | 4/2012 | Tatoian et al. | | |
| 2014/0285086 A1* | 9/2014 | Stark | ..................... | H01J 23/213 |
| | | | | 315/35 |
| 2018/0058826 A1 | 3/2018 | Podgorski | | |

FOREIGN PATENT DOCUMENTS

| | | |
|---|---|---|
| EP | 1947464 A1 | 7/2008 |
| EP | 2144363 A1 | 1/2010 |
| EP | 2397809 A2 | 12/2011 |
| EP | 2546928 A1 | 1/2013 |
| GB | 619958 A | 3/1949 |

\* cited by examiner

RADIATION SOURCE FOR MICROWAVE PULSES AND RADIATION DEVICE

CROSS-REFERENCE TO RELATED APPLICATION

This application claims the priority, under 35 U.S.C. § 119, of German application DE 10 2018 004 568.5, filed Jun. 8, 2018; the prior application is herewith incorporated by reference in its entirety.

BACKGROUND OF THE INVENTION

Field of the Invention

The invention relates to a radiation source for emitting an electromagnetic high-power-electro-magnetics (HPEM) microwave pulse and to a radiation device having the radiation source and a control device.

HPEM effector systems make it possible, inter alia, to deliberately direct interference pulses into a wide variety of electronic systems in order to block their functionality.

These products give the opportunity to protect emergency services from improvised explosive devices (IED), to stop getaway vehicles in moving traffic without using physical force and to stop permanent damage to the electronics and to prevent unauthorized access to security areas. In addition, an HPEM effector provides the ability to defend against small, unmanned aircraft.

An HPEM-DS (damped sinusoid) effector system is known, for example, from European patent EP 2 144 363 B1, corresponding to U.S. Pat. No. 8,358,176.

SUMMARY OF THE INVENTION

The object of the present invention is to propose an improved radiation source for emitting an electromagnetic HPEM microwave pulse and an improved radiation device.

The radiation source contains a microwave generator for generating the pulse. The generator has a generator opening for outputting or emitting the pulse. The generator is, in particular, a damped sinusoid (DS) generator. The radiation source also contains a horn structure for shaping the pulse. The horn structure has an input opening. The input opening is connected to the generator opening; in particular, the generator opening and the input opening coincide. The input opening is used to radiate in the pulse generated by the generator. The horn structure also has an emission opening. The latter is used to emit the shaped pulse from the horn structure or from the radiation source. The generator has at least two pulse sources. Each of the pulse sources is used to respectably generate a pulse component. The pulse is the sum or superimposition of the pulse components.

The input opening therefore forms a first "end" of the horn structure, through which the pulse which has not yet been shaped enters the horn structure. The pulse shaping takes place in the horn structure. The emission opening forms the other end of the horn structure, at which the shaped pulse emerges from the latter. The "sum" of the pulse components is formed in the form of a superimposition. The radiation source has a central direction or a centre longitudinal axis or line. The pulse is emitted in an emission direction during operation of the radiation source. The central direction is, in particular, the emission direction or a central emission direction for pulses from the emission opening. In this case, the "emission direction" is, in particular, the direction of a central beam or a main emission direction (for example with the greatest radiation density), a—for example geometrical—center direction of emission or the like for the pulse. Within the radiation source in particular, the central direction may be, in particular, a straight line or else a line which is curved or angled at least in sections. The central direction is a fixed or design property of the arrangement. The emission direction is a property of the pulse. The latter can also vary if the arrangement is configured for beam deflection (see below). In particular, the emission direction can then be inclined starting from the central direction. In this case, the at least two pulse sources are referred to as an "array" of pulse sources.

The horn structure may be any structure shaped in the manner of a microwave horn, in particular a "horn" which is conventional or known from practice and is suitable for the relevant purpose or any "horn antenna" for microwave applications. In this case, the pulse is shaped in a known manner, in particular focused, directed, concentrated etc., as it passes through the horn structure.

The following advantages arise according to the invention: the synergistic use of both technologies (horn antenna technology and array technology) makes it possible to considerably increase the injected power and therefore the "power density" or the emitted power and therefore the range for a predefined aperture area (area of the emission opening) and/or horn length (length of the horn along the horn limb) of HPEM effector systems in comparison with a system having a single pulse source ((DS) resonator/antenna/dipole/monopole/stub). The technology can be used to considerably increase the power and the range of HPEM systems of a predefined size and/or to considerably reduce the size of an HPEM system for a predefined range and/or to increase the range with additionally increasing size in a disproportionate manner.

According to the invention, the two technologies are combined to form a new overall system technology. The use of the interactive relationships between the array concept and the horn concept in a common system for HPEM applications is very complex and novel and, in HPEM-DS systems, enables completely new perspectives in the implementation of long-range HPEM-DS effector systems. The pulse sources are operated, in particular, in phase, with the result that emitted waves are structurally superimposed.

The following advantages and possible applications also arise according to the invention.

An increase in the range of HPEM systems for different applications (for example counter-UAS (unmanned aerial system), base protection, stopping of boats/ships).

An increase in the power density and therefore the ability to be integrated in different platforms for a predefined range/power.

An application of the principle to one or more supply horns of parabolic antennas in order to increase the injected power or the range.

In one preferred embodiment of the invention, as already indicated above, the pulse source contains a resonator and/or an antenna and/or a stub for generating the pulse component. Alternatively, the pulse source is such an element. The advantages of the individual elements can therefore also be used for the radiation source.

In one preferred embodiment, the generator and/or the horn structure contain(s) a waveguide for guiding the pulse components and/or the pulse and/or for summing the pulse components. The waveguide has, in particular, the generator opening, that is to say extends towards the latter. The waveguide has, in particular, the input opening, that is to say extends away from the latter. At least one pulse source, in particular all pulse sources, is/are arranged in one of the waveguides or connected to the latter, in particular. The pulse components or the pulse is/are therefore either injected into the waveguide after they have been produced or are generated in the waveguide during operation. In particular, the radiation source has an interconnection of a plurality of individual waveguides or corresponding waveguide sections. The RF pulses can be guided, deflected, processed etc. in a particularly effective manner with the aid of waveguides.

In one preferred embodiment, at least one of the pulse sources is therefore arranged in one of the waveguides. This results in a particularly compact embodiment of the generator with an integrated waveguide.

In one preferred embodiment, the generator and/or the horn structure and/or—if present—at least one of the waveguides has/have a square cross section with respect to the central direction of the radiation source explained above. In particular, a triangular, quadrangular, rectangular, square or polygonal structure is involved. Alternatively, round, circular, oval or any other desired shapes are also conceivable. Such shapes have proven in practice to be suitable for HPEM pulses.

In one preferred embodiment, the generator has a continuous interior in which the pulse sources are arranged. The interior is therefore a cavity which is continuous overall and does not have any separating walls, internal walls, divisions etc.; the generator can therefore be easily configured and produced. In particular, no separating walls or the like are present on the respective connecting lines between respective pulse sources, but rather only free (air) space.

In one preferred embodiment, the—in particular continuous—interior has a pot-like or box-like design. The only walls delimiting the generator with respect to the exterior are therefore formed as part of a cuboid or cylinder which is open on one side. In particular, a base of the generator which is opposite the generator opening is flat or curved. The walls (in particular one, two, three or four edge-free walls) connecting the base to the generator opening are straight, in particular at least in sections, or expand towards the generator opening, in particular in a conical manner. The generator opening therefore forms a pot or box opening of the pot which is open only on this one side or of such a box. All other walls are closed. Such shapes can be configured and produced in a particularly simple manner and have proved themselves in practice for the HPEM application.

In one preferred embodiment, at least two, in particular at least three or four, of the pulse sources are arranged along a line in the generator. The line runs transversely with respect to the emission direction, in particular. This results in a particularly simple and effective source structure or a line array. The pulse sources can also be arranged (for example in groups) along a plurality of lines, including in the manner of a grid, for example.

In one preferred embodiment, the pulse sources are arranged together in a plane. This applies, in particular, together with the above-mentioned line array. The plane runs, in particular, transversely with respect to the central direction of the generator explained above. This is also a particularly simple and effective source structure or a flat array.

In one preferred embodiment (or an alternative embodiment to the above-mentioned continuous interior), the generator contains at least one separating wall, that is to say does not have a continuous interior, in particular. Respective individual channels for pulse components are formed or separated from one another by each of the separating walls.

At least one of the pulse sources is contained in each of the individual channels. Each of the individual channels has a respective channel opening for emitting the respective pulse components from the respective pulse sources. The pulse components from a plurality of individual sources of an individual channel are already at least partially superimposed on one another at the channel opening of the relevant channel if at least two pulse sources are contained in one of the individual channels. In particular, each individual channel contains precisely one of the pulse sources. In particular, at least one of the channels, in particular all channels, is/are in the form of (a) waveguide(s) (in particular waveguides explained above). Deliberate pulse shaping can therefore already be carried out inside the generator.

In one preferred variant of this embodiment, the generator opening is formed from the sum of channel openings. This results in particularly effective use of the generator opening or a space-saving design for the generator.

In one preferred variant of this embodiment, at least one of the individual channels is a cylindrical channel. The cylindrical shape has, in particular, a rectangular, square, round or circular cross section and/or is straight or varies in diameter. This applies, in particular, along one direction towards the channel opening. Such channel shapes have proved to be particularly favourable for HPEM applications.

In one preferred variant of this embodiment, at least one of the individual channels has a horn-shaped section. The above-mentioned statements with respect to known horns also apply here. The known advantages of a horn structure therefore also already arise for the respective individual channel.

In one preferred variant of this embodiment, the horn-shaped section adjoins the channel opening. The section is therefore present on the output side in the subchannel, that is to say opens into the respective channel opening. In particular, the result is thus a combined horn shape which already begins in at least one of the subchannels and then continues in the common actual horn structure.

The object of the invention is also achieved by means of a radiation device. This device contains a radiation source according to the invention and a control device for triggering the pulse sources in a temporally synchronized manner for the purpose of respectively emitting a pulse component. In this case, the temporal synchronization may involve triggering at least two or all pulse sources at the same time. Alternatively or additionally, at least two or all pulse sources can also be triggered with a delay. Phase control of the pulse sources can therefore be carried out in a conventional manner or in a manner which is usual in practice. This may result in an increase in the amplitude in the pulse and/or in a controlled change in the direction in which the pulse is emitted by the radiation source.

Otherwise, the radiation device and at least some of its embodiments as well as the respective advantages have already been analogously explained in connection with the radiation source according to the invention.

Tilting of the resulting emission characteristic in the array of microwave generators is known, for example, from European patent EP 1 947 464 B1.

The invention is based on the following knowledge, observations and considerations and also has the following embodiments. In this case, the embodiments are partly also called "the invention" in a simplifying manner. In this case, the embodiments may also contain parts or combinations of the embodiments mentioned above or may correspond thereto and/or may possibly also include embodiments which have not previously been mentioned.

The invention is based on the idea of increasing the power and range of HPEM effector systems while simultaneously reducing/maintaining the size of the effector system and of increasing the "power density" of HPEM effector systems in general.

The invention is based on the consideration that the range and power of HPEM systems could be increased by means of the following methods:
1. Increasing the power of the individual resonator/system by increasing the voltage/field amplitude.
2. Increasing the range and directivity of an individual system by using directional antenna systems, reflector systems or horn antennas.
3. Using the array principle: using a plurality of DS resonators/antenna rods, which are connected in parallel and operate in a temporally synchronous manner, in a plane. During synchronous operation, the range and direction (focusing) increase according to the array principle (array factor). During phase-controlled operation, beam steering (electronic deflection/tracking of the beam) can be achieved if the phases of the individual resonators are correctly controlled with respect to one another. An increase in the range increases the number of emitting antenna elements and therefore increases the emitting antenna aperture.
4. Using horn antennas: the use of a horn antenna structure with a dipole or a short rod antenna (stub) as an emitting element in the horn antenna makes it possible to considerably improve the focusing of the HPEM beam and therefore to considerably improve the range (gain) in comparison with the use of a simple dipole antenna or a dipole antenna with a simple reflector. An increase in the range increases the power injected into the antenna dipole/antenna stub, the emitting antenna area (aperture area on the horn) and/or the length of the horn structure.

The invention is also based on the consideration that the following procedures are conceivable.

Array Principle:

Increase in the range and electronic phase control (beam steering) of the radiation field by means of phase-synchronous or phase-controlled emission of the individual antennas (resonators/stubs/monopoles/dipoles) in the array. The increase in the range is scaled with the size of the antenna (array active area/emitting area) and the number of antennas/resonators used in the array.

Horn Antenna Principle:

Gain factors in the emission direction of up to several 10 dB can be achieved by feeding the electromagnetic wave or the pulse into a horn structure through an antenna stub/dipole/resonator/monopole. This depends on the size of the emitting area (aperture) and the illumination/assignment of this aperture, which is also determined by the opening angle of the horn and the horn length. The greater the focusing by the horn structure, the greater the range of the electromagnetic signal.

The invention is based on the following described idea.

The combination of the array technology with the horn antenna technology considerably increases the injected and emitted power and range while the dimensions of the horn aperture/(structure) remain the same. Integrating an antenna array in an antenna waveguide, which directly adjoins the horn, and therefore in the antenna horn combines both effects with one another and makes it possible to considerably increase the injected power in the horn and the emitted power. The wavefronts emitted by the individual resonators/antennas/stubs in the array are structurally superimposed in the interior of the waveguide or the horn structure. The dimensions of the waveguide and of the horn structure are matched to one another in this case according to the frequencies/wavelengths to be emitted, the number of resonators and the distance between the resonators and between the resonators and the walls of the waveguide or of the horn. A separate waveguide can also be used for each individual resonator in the waveguide/horn array. In this case too, the dimensions of the waveguide(s) are matched to the emitted frequencies and the number of resonators, the distances between the latter and the distances to the walls/waveguide/horn structure. This makes it possible to considerably increase the power of a system/antenna horn with a predefined aperture area and/or length by injecting power into the horn via a plurality of resonators/dipoles/monopoles/stubs. The important factor is that the power density of the system (power density=injected or emitted power per active area/aperture (horn) or per volume (horn)) is increased in this case. In addition to the use of the array in the waveguide/horn, the aperture and/or the entire dimensions of the horn can also be increased, for example, in order to further increase the emitted power or the power density.

Depending on the size of the horn and the injected/emitted wavelength/pulse shape/rise times/amplitude, a plurality of (more than two) DS resonators/stubs/dipoles/monopoles can also be accommodated in an antenna horn as a DS array.

A HPEM DS high-power horn array therefore results according to the invention.

According to the invention, the range and power of HPEM systems are increased by coupling the HPEM array principle with an HPEM horn antenna by integrating a plurality of HPEM DS resonators (HPEM DS array) or other antenna structures (rod antenna, dipole antenna) in one or more HPEM horn antenna structures.

Other features which are considered as characteristic for the invention are set forth in the appended claims.

Although the invention is illustrated and described herein as embodied in a radiation source for microwave pulses and a radiation device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
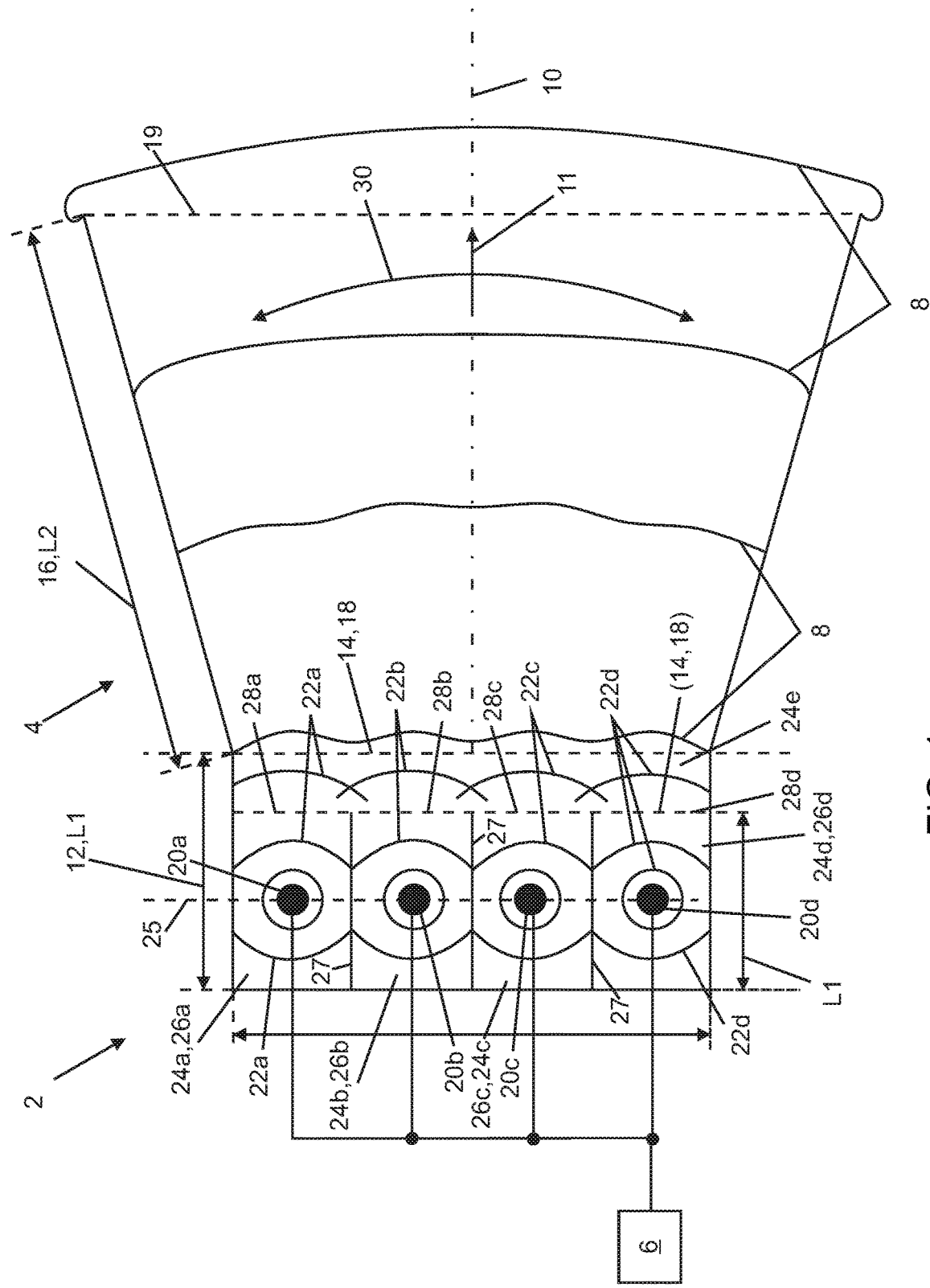
FIG. 1 is an illustration of a radiation device with a radiation source during operation in lateral section.

Referring now to the figures of the drawings in detail and first, particularly to FIG. 1 thereof, there is shown a radiation device 2 containing a radiation source 4 and a control device 6. The radiation source 4 is used to emit an electromagnetic HPEM microwave pulse 8. FIG. 1 shows the radiation device 2 during operation, in which case the pulse 8 is symbolically indicated in the form of a wavefront. In this case, the pulse 8 is emitted by the radiation source 4 in an emission direction 11. In this case, the emission direction 11 represents a central beam for the pulse 8. The emission direction 11 here runs parallel to the central direction 10—here a straight line or center longitudinal axis—of the radiation device 2.

The radiation source 4 contains a microwave generator 12 for generating the pulse 8. In this case, the generator 12 has a generator opening 14 which is indicated using dashed lines and through which the pulse 8 is emitted from the generator 12 during operation.

The radiation source 4 also contains a horn structure 16 for shaping the pulse 8. The horn structure 16 has an input opening 18 which is connected to the generator opening 14 and coincides with the generator opening 14 in the example. The input opening 18 is used to radiate the pulse 8 into the horn structure 16. The horn structure 16 also has an emission opening 19 which is indicated using dashed lines and is used to emit the shaped pulse 8 from the horn structure 16 and therefore from the radiation source 4. The horn structure consists in this case of four trapezoidal planes which together form a horn having a rectangular cross section which conically widens towards the emission opening 19.

In the example, the generator 12 contains four pulse sources 20a to 20d which together form an array. Each of the pulse sources 20a to 20d is an antenna or a resonator and is used to respectively generate a pulse component 22a to 22d. Each of the pulse components 22a to 22d is likewise symbolized by wavefronts in FIG. 1. The pulse 8 is the sum or superimposition of the pulse components 22a to 22d. The sum is formed by superposing the wavefronts.

In the example, the generator 12 contains four waveguides 24a to 24d. One of the pulse sources 20a to 20d is arranged in each of the waveguides 24a to 24d. The pulse sources 20a to 20d are arranged in the generator 12 as a line array along a line 25, here a straight line. Each of the waveguides 24a to 24d is used to guide one of the pulse components 22a to 22d which are each generated inside the waveguide 24a to 24d. The waveguides 24a to 24d constitute respective individual channels 26a to 26d. The generator 12 contains three separating walls 27 in order to separate the individual channels 26a to 26d from one another. A respective one of the pulse sources 20a to 20d is therefore also arranged or contained in each of the individual channels 26a to 26d. Each individual channel 26a to 26d has a respective channel opening 28a to 28d which is used to emit the respective pulse component 22a to 22d from the respective pulse source 20a to 20d. All individual channels 26a to 26d are cylindrical, here with a rectangular cross section and as straight cylinders with a uniform cross section.

The respective output openings (channel openings 28a to 28d) of the waveguides 24a to 24d open into a further waveguide 24e of the generator 12. This further waveguide also has a straight cylindrical shape with a rectangular cross section. The pulse components 22a to 22d are summed or superimposed to form the pulse 8 in said further waveguide and in the subsequent horn structure 16. The waveguide 24e has the sum of the output openings of the waveguides 24a to 24d as an input opening and has the generator opening 14 as an output opening.

In an alternative point of view, the waveguide 24e will already be considered to be part of the horn structure 16 and no longer belongs to the generator 12. The generator opening 14 and the input opening 18 are then shifted to the "rear" contrary to the emission direction 11 and coincide with the channel openings 28a to 28d. In other words, the sum of the channel openings 28a to 28d forms the generator opening 14 and the input opening 18. This is indicated in brackets in FIG. 1.

Generally, the length L1 of the generator 12 (or partial lengths of the waveguides 24a to 24e) and the length L2 of the horn structure 16 can be varied, inter alia, within the scope of the design or construction or dimensioning of the radiation source 4; also see, in this respect, FIGS. 2A to 4C with explanations.

The control device 6 is used to trigger the pulse sources 20a to 20d in a temporally synchronized manner to respectively emit a pulse component 22a to 22d. The triggering is carried out here in a simultaneous manner, in particular, in order to increase the intensity of the pulse 8 or at different triggering times in a phase-controlled manner in order to vary or tilt the emission direction 10 in the direction of the double-headed arrow 30.

Figure 2B:
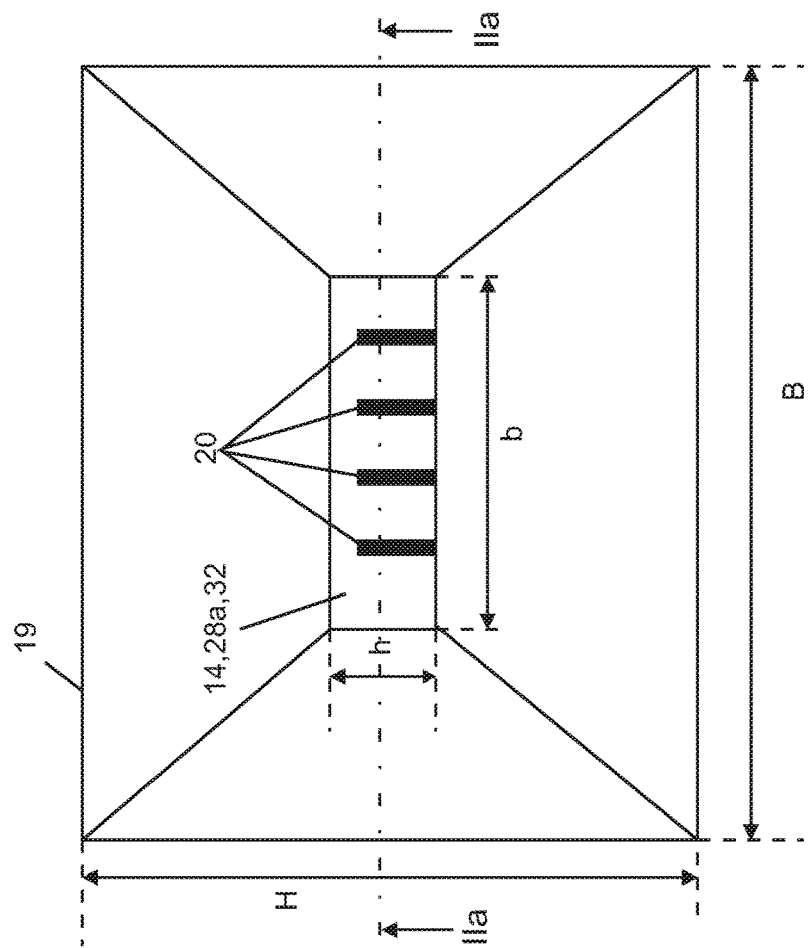
FIG. 2B is a front view of the alternative radiation source having four pulse sources.
Figure 2A:
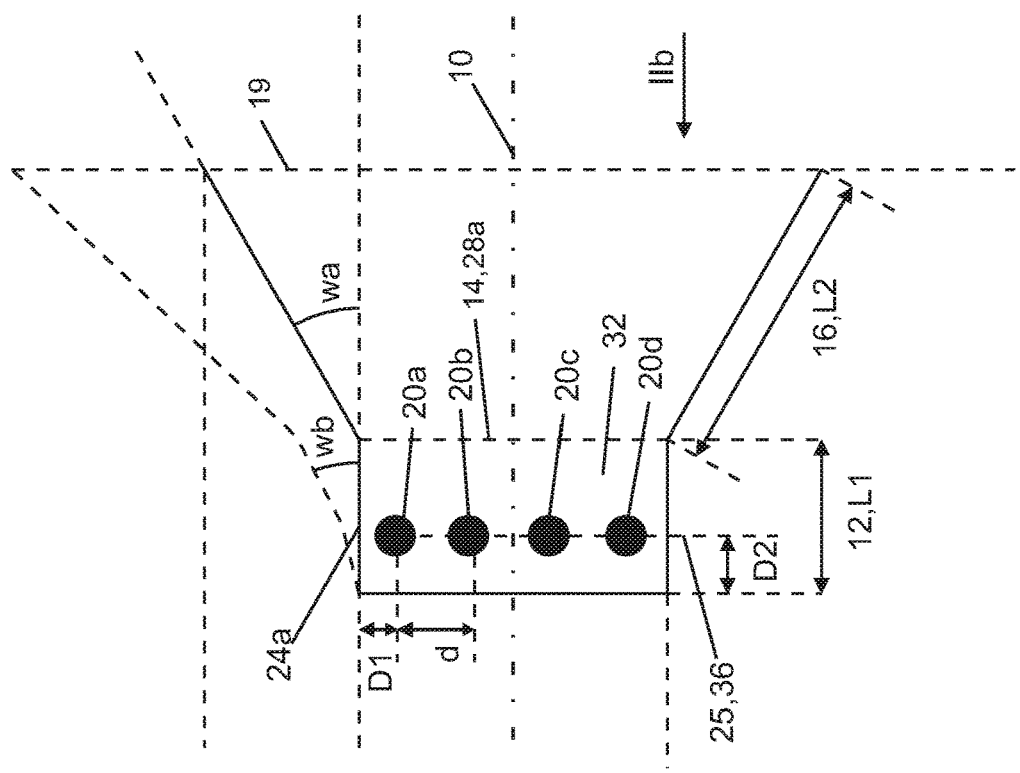
FIG. 2A is an illustration showing an alternative radiation source having four pulse sources in an illustration according to FIG. 1.

FIG. 2A shows an alternative radiation source 4 which is constructed substantially according to the radiation source 4 from FIG. 1. However, the difference is that the generator 12 has a continuous interior 32, that is to say it does not contain any separating walls 27 and no individual channels 26 are therefore formed. Rather, the generator 12 is in the form of a single waveguide 24a with a channel opening 28a. All four pulse sources 20a to 20d are again arranged in the interior 32 in the form of an array along the line 25 or straight line.

Further design freedoms when designing the radiation source 4 are also illustrated here. The following can be varied:
a) the wall distances D1 (lateral, transverse with respect to the central direction 10) and D2 (in the longitudinal direction or along the central direction 10) between the pulse source 20 and the respective surrounding wall of the generator 12,
b) the distances d between the pulse sources 20,
c) the length L1 of the generator in the central direction 10,
d) the length L2 of the horn structure 16 (in the direction of extent of the wall of the horn structure 16),
e) the number of pulse sources 20 (two to n),
f) the opening angle wb of the side walls of the generator 12,
g) the opening angle wa of the horn structure 16,
h) the width b and height h of the generator 12 and of the waveguide 24a and of the generator opening 14,
i) the width B and height H of the horn structure 16 and of the actual conical horn and of the emission opening 19,
j) the distances between the individual pulse sources and the associated channel opening, and
k) the length of the individual waveguides, but at most L1.

It can be gathered from FIG. 2B, in particular, that both the generator 12 and the horn structure 16 have an angular, here rectangular, cross section with respect to the central direction 10. It can also be seen here that the interior 32 therefore has a box-like design or is in the form of a cuboid.

Figure 3:
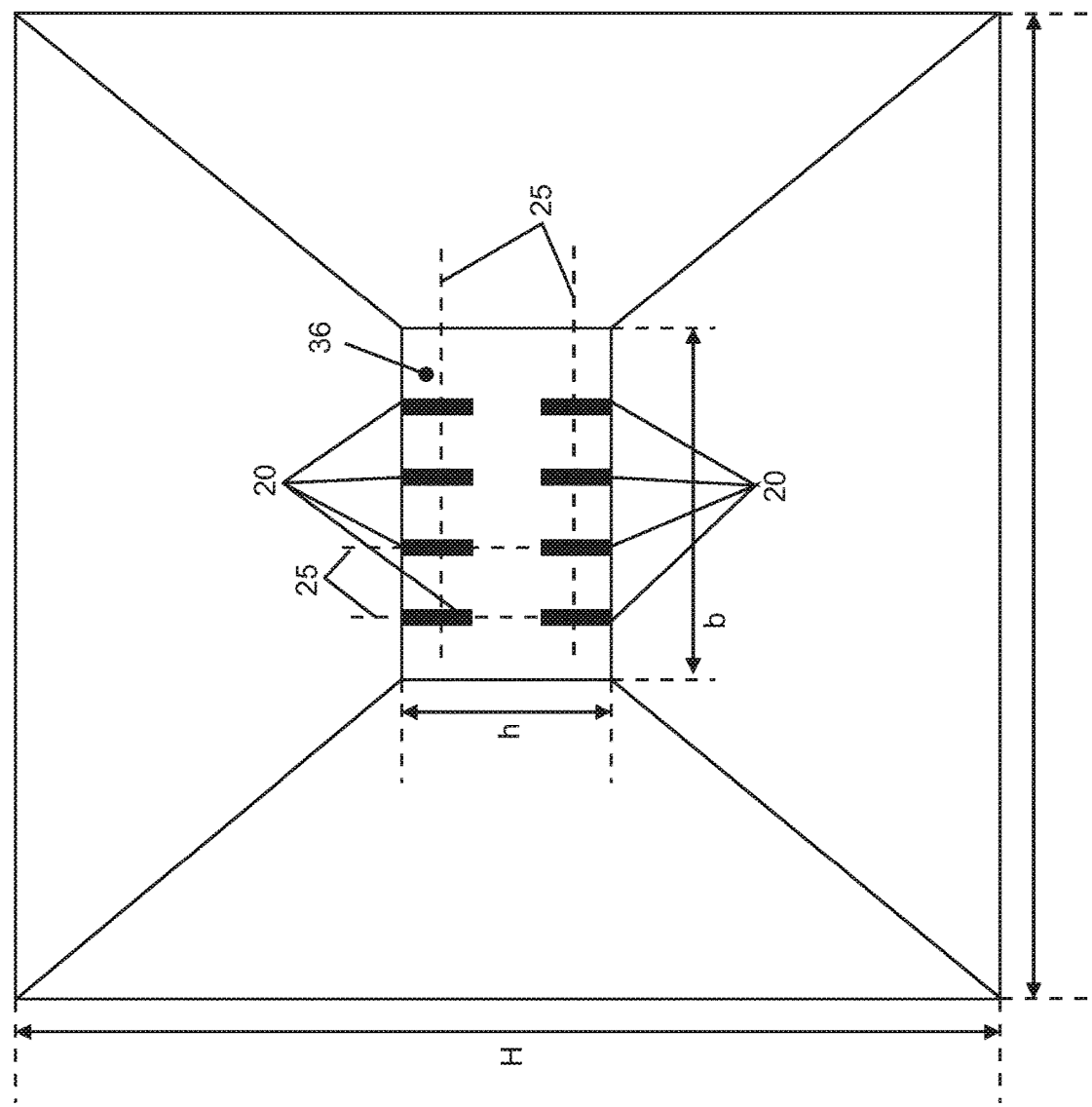
FIG. 3 is an illustration showing the alternative radiation source having eight pulse sources in an illustration according to FIG. 2B.

FIG. 3 shows, by way of example, an alternative radiation source 4 from FIG. 2, but varied in terms of different parameters (B, H, b), in particular the height h of the waveguide 24a and the number of n=eight, instead of n=four, pulse sources 20. In addition, the pulse sources 20 are each arranged in groups of four along lines 25 in FIG. 3 and also in a common plane 36 (symbolically illustrated in FIG. 2A).

Figure 4C:
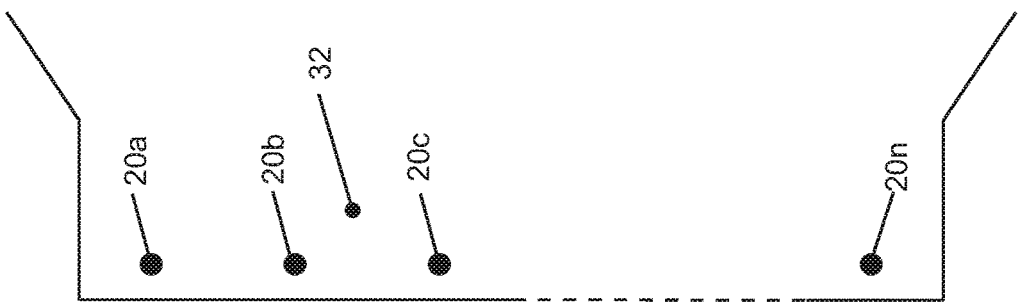
FIG. 4A-4C are illustrations showing alternative radiation sources having a plurality of pulse sources wherein in FIG. 4A there are individual channels having horn-shaped sections, in FIG. 4B there are straight individual channels and in FIG. 4C there is a continuous interior, in each case in an illustration according to FIG. 1.
Figure 4B:
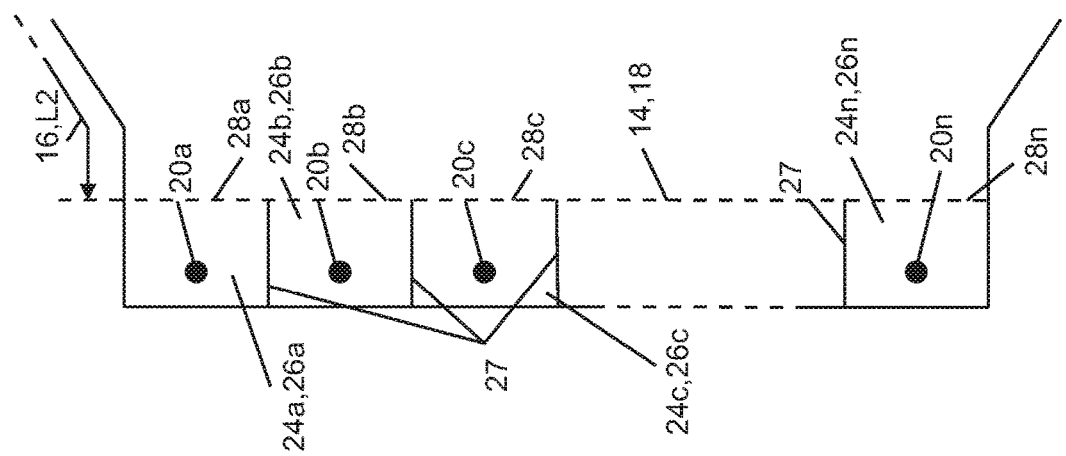
Figure 4A:
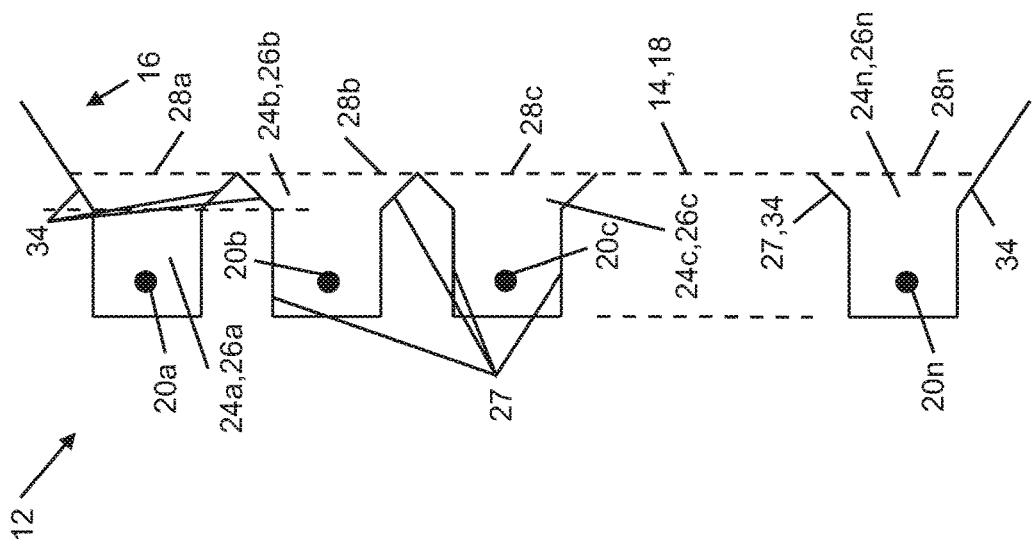

FIGS. 4A-4C shows further alternative radiation sources 4 with the following design variations: the horn structure 16 is respectively indicated only in a shortened form. FIG. 4A symbolically shows, for a general number of n (greater than or equal to two) pulse sources 20, respective individual channels 26a to 26n and waveguides 24a to 24n each having a respective horn-shaped section 34 (indicated using dashed lines for the individual channels 26a, 26b) which adjoins the respective channel opening 28a to 28n. In other words, the respective individual channel 26a to 26n ends with a horn-shaped end section (section 34) at the respective channel opening 28a to 28n. The generator opening 14 is again formed as the sum of the channel openings 28a to 28n. The horn structure 16 adjoins the outside sections 34 of the individual channels 26a, 26n in a seamless manner and at the same angle.

FIG. 4B shows a variation with respect to FIG. 4a in which there are no horn-shaped sections 34, but rather the individual channels 26a to 26n are in the form of straight cylinders. The horn is also formed here from a straight section and a conical section, which is why the generator opening 14 and the input opening 18 have been "set back" in comparison with FIG. 4A contrary to the central direction 10.

FIG. 4C shows a variation with respect to FIG. 4B in which the separating walls 27 have been omitted, which is why the result is a continuous interior 32 in which all pulse sources 20 are arranged.

The following is a summary list of reference numerals and the corresponding structure used in the above description of the invention:
2 Radiation device
4 Radiation source
6 Control device
8 Pulse
10 Central direction
11 Emission direction
12 Generator
14 Generator opening
16 Horn structure
18 Input opening
19 Emission opening
20a to 20n Pulse source
22a to 22d Pulse component
24a to 24n Waveguide
25 Line
26a to 26n Individual channel
27 Separating wall
28a to 28n Channel opening
30 Double-headed arrow
32 Interior
34 Section
36 Plane
L1 Length (waveguide/generator)
L2 Length (waveguide/horn structure)
D1, D2 Wall distance
wa, wb Opening angle
b, h Width, height (waveguide)
B, H Width, height (horn structure)

The invention claimed is:

1. A radiation source for a radiation device, the radiation source for emitting a high-power-electro-magnetic (HPEM) microwave pulse, and the radiation source comprising:
a microwave generator including an array of at least two pulse sources, each of said at least two pulse sources configured for generating a pulse component, said microwave generator formed with a generator opening configured for outputting said pulse components of said at least two pulse sources;
a horn structure formed with an input opening connected to said generator opening, said horn structure configured to form the HPEM microwave pulse by at least superimposing and shaping said at least two pulse components, said horn structure further having an emission opening configured to directly emit the HPEM microwave pulse out of the radiation source.

2. The radiation source according to claim 1, wherein said microwave generator contains at least one separating wall, wherein respective individual channels are separated from one another by said separating wall, wherein at least one of said pulse sources is contained in each of said respective individual channels, wherein each of said respective individual channels has a respective channel opening for emitting the pulse component from a respective one of said pulse sources.

3. The radiation source according to claim 2, wherein at least one of said respective individual channels has a horn-shaped section.

4. The radiation source according to claim 3, wherein said horn-shaped section adjoins said respective channel opening.

5. The radiation source according to claim 2, wherein said generator opening is formed from a sum of channel openings of said respective individual channels.

6. The radiation source according to claim 2, wherein at least one of said respective individual channels is a cylindrical channel.

7. The radiation source according to claim 1, wherein at least one device selected from the group consisting of said microwave generator and said horn structure includes at least one waveguide for performing at least one function selected from the group consisting of guiding the pulse components, guiding the HPEM microwave pulse, and summing the pulse components.

8. The radiation source according to claim 7, wherein at least one of said pulse sources is disposed in said waveguide.

9. The radiation source according to claim 7, wherein at least one of said microwave generator, said horn structure, or said waveguide, has a square cross section with respect to a central direction of the radiation source.

10. The radiation source according to claim 1, wherein said microwave generator has a continuous interior in which said pulse sources are disposed.

11. The radiation source according to claim 10, wherein said microwave generator has a pot-shaped or box-shaped configuration.

12. The radiation source according to claim 1, wherein each one of said at least two pulse sources includes a device, which is selected from the group consisting of a resonator, an antenna, and a stub, for generating the pulse components.

13. The radiation source according to claim 1, wherein said pulse sources are disposed along a line in said microwave generator.

14. The radiation source according to claim 1, wherein said pulse sources are disposed together in a plane.

15. A radiation device, comprising:

a radiation source for emitting a high-power-electromagnetic (HPEM) microwave pulse, said radiation source including:
- a microwave generator including an array of at least two pulse sources, each of said at least two pulse sources configured for generating a pulse component, said microwave generator formed with a generator opening configured for outputting said pulse components of said at least two pulse sources, and
- a horn structure formed with an input opening connected to said generator opening, said horn structure configured to form the HPEM microwave pulse by at least superimposing and shaping the at least two pulse components, said horn structure further having an emission opening configured to directly emit the HPEM microwave pulse out of the radiation source; and a control device for triggering said at least two pulse sources in a temporally synchronized manner for a purpose of respectively emitting the pulse components.

16. The radiation source according to claim 1, wherein said microwave generator does not include a separating wall disposed between any of said at least two pulse sources.

* * * * *